United States Patent [19]
Jenkins, IV et al.

[11] Patent Number: 5,742,178
[45] Date of Patent: Apr. 21, 1998

[54] PROGRAMMABLE VOLTAGE STABILIZING CIRCUIT FOR A PROGRAMMABLE INTEGRATED CIRCUIT DEVICE

[75] Inventors: Jesse H. Jenkins, IV, Danville; Nicholas Kucharewski, Jr., Pleasanton; David Chiang, Saratoga, all of Calif.

[73] Assignee: Xilinx, Inc., San Jose, Calif.

[21] Appl. No.: 740,118

[22] Filed: Oct. 22, 1996

Related U.S. Application Data

[63] Continuation of Ser. No. 307,983, Sep. 14, 1994, abandoned.

[51] Int. Cl.$^6$ ................................. H03K 19/003
[52] U.S. Cl. ................................. 326/33; 326/50
[58] Field of Search ................................. 326/38, 49, 50, 326/33; 327/525

[56] References Cited

U.S. PATENT DOCUMENTS

| | | |
|---|---|---|
| 4,158,147 | 6/1979 | Edwards ................................. 326/38 |
| 4,612,459 | 9/1986 | Pollachek ................................. 326/38 |
| 4,806,793 | 2/1989 | Golab ................................. 326/38 |
| 5,361,001 | 11/1994 | Stolfa ................................. 327/525 |

FOREIGN PATENT DOCUMENTS 5-82651   4/1993   Japan.

*Primary Examiner*—Edward P. Westin
*Assistant Examiner*—Benjamin D. Driscoll
*Attorney, Agent, or Firm*—Edel M. Young; Skjerven, Morrill, MacPherson, Franklin, & Friel

[57] ABSTRACT

In a programmable logic device having a plurality of external pins each of which may be driven by an output drive structure controlled by a programmable logic block, a logic device such as an OR gate or a programmable pull-up or pull-down switch is inserted between the input terminal of the output drive structure and the programmable logic block or other internal logic block which controls the output driver. This inserted structure allows the macrocell to be used for internal logic while the output drive structure is used to stabilize power or ground voltage.

6 Claims, 2 Drawing Sheets

PROGRAMMABLE VOLTAGE STABILIZING CIRCUIT FOR A PROGRAMMABLE INTEGRATED CIRCUIT DEVICE

This application is a continuation of application Ser. No. 08/307,983, filed Sep. 14, 1994, abandoned.

FIELD OF THE INVENTION

The invention relates to integrated circuit programable logic devices and to structures for preventing ground bounce.

BACKGROUND OF THE INVENTION

A recurring problem with high performance programmable logic devices is instability of the power or ground voltage signal when many internal points are switching simultaneously. Internal power supply voltage and ground voltage are typically provided by connecting internal power and ground lines or planes through external pins to external power and ground voltage sources. If the path from internal to external power or ground is through a line of some length, this line provides an inductive component which influences internal power or ground voltage according to the equation $$\Delta V = L\, di/dt$$

where $\Delta V$ is the change in voltage at an internal power or ground supply point, L is inductance of the power or ground line current path (including the pin)

di/dt is the rate of change with respect to time of current through the power or ground line.

Thus, unstable power or ground voltage occurs in response to relatively fast changes in current passing through these inductive circuit paths. When internal power or ground voltages are unstable, some devices must include circuitry to postpone reading of an internal output signal until ground or power voltage has settled. This causes an undesirable degradation in the speed at which the device can operate. Unstable ground or power voltage also causes noise internal to the device and may cause unreliable behavior.

As integrated circuit devices become more highly integrated, the problem of ground instability increases. High pin count devices in which a single pin must drive a fairly high current are particularly susceptible to ground instability and resulting unreliable operation.

One way to stabilize power and ground voltages is to increase the number of power and ground pins connected to an external power or ground source. Unfortunately, pins are precious resources and for any particular integrated circuit package there are a fixed number of pins. Thus, every pin which must be used for power or ground reduces the number of pins available for signals.

In programmable logic devices, it is typically possible to use a selectable number of pins for the power and ground signals. That is, for different applications of the same identical programmable integrated circuit chip, different numbers of pins may be connected to external power or ground sources and correspondingly to internal power or ground planes. However, programmable pins are typically connected to internal input/output logic devices or simply to internal logic blocks (EPLD macrocell or FPGA logic block), and in such programmable logic devices any internal input/output logic device or internal logic block connected to a pin used for power or ground becomes unavailable for other internal logic.

FIG. 1 shows a macrocell 11 which is part of a programmable integrated circuit device and provides programmable logic to an output pin 13 through inverter 12. Typically the programmable integrated circuit device will include many macrocells each driving a corresponding output pin. Macrocell 11 also provides logic on feedback path 14a to other points within the integrated circuit device. If the logic which will be programmed into the device will not use macrocell 11, then this macrocell can be programmed to drive line 14 with a constant logical 1 and thus cause inverter 12 to turn on transistor 12b and connect external pin 13 to internal ground point 19a. The voltage at internal ground point 19a is supplied by an external (stable) ground source 19b through pin 19. The inductive component of this path is represented by inductor 19c. If external pin 13 has been connected to an external ground voltage source 19b, transistor 12b provides an extra connection between the internal ground plane including ground point 19a and an external stable ground source 19b.

Almost any programmable logic device can be programmed this way and benefit from having a more stable ground voltage as a result. Any unused pins can be connected to external power or ground sources and to internal power or ground planes to increase power and ground stability. However, macrocell 11 must be sacrificed to this purpose and may not be used for other internal logic.

SUMMARY OF THE INVENTION

The present invention allows unused external pins to be used for power or ground stabilization without sacrificing the related logic structure.

According to the invention, a logic device such as an OR gate or a programmable pull-up or pull-down switch is inserted between the input terminal of an output drive structure and the macrocell or other internal logic block which controls the output drive structure. This inserted logic device is programmably enabled. This inserted logic device allows the macrocell to be used for internal logic while the output drive structure is used to stabilize power or ground voltage. Thus the benefit of power and ground stability is achieved with the consequent improved performance and reliability. Yet additional external pins are not required and internal logic usable for other purposes is not sacrificed.

DETAILED DESCRIPTION OF SOME EMBODIMENTS OF THE INVENTION

Figure 1:
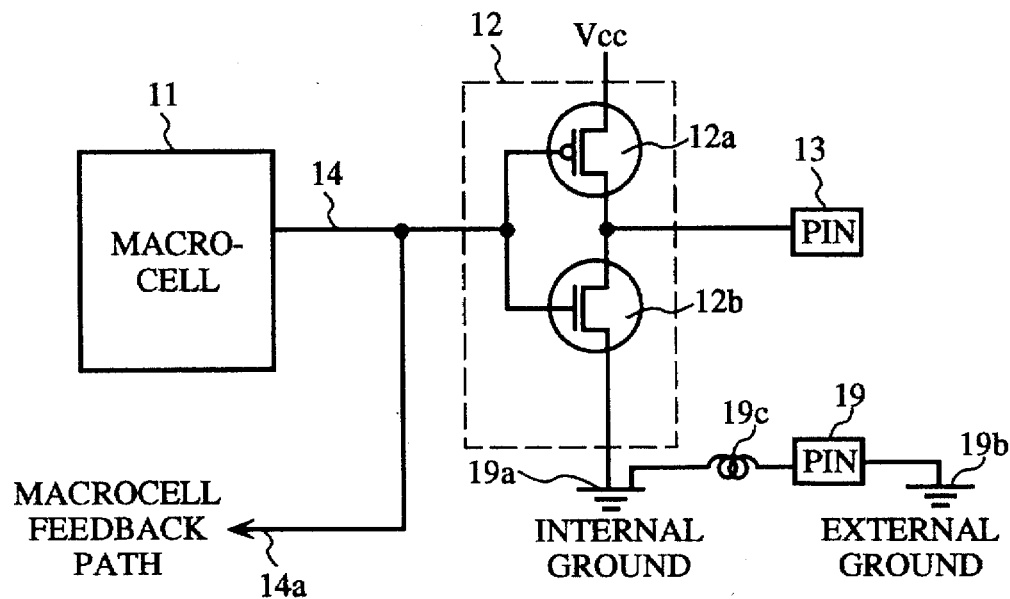
FIG. 1 shows a prior art structure including an internal logic block or macrocell having an internal feedback path and means for driving an external pin.
Figure 2:
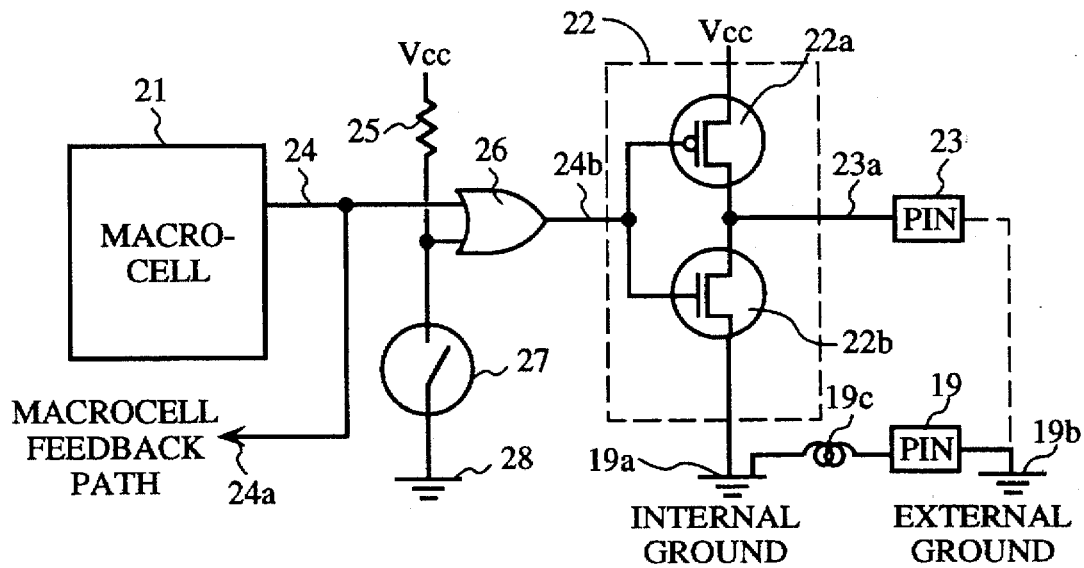
FIG. 2 shows a structure according to the invention in which a switching structure is inserted between an internal logic block and the means for driving an external pin.

The embodiment of FIG. 2 provides a programmable ground pin in combination with a logic macrocell. In a first mode, macrocell 21 drives pin 23 with an output signal. In a second mode, macrocell 21 drives internal logic and pin 23 connects a stable external ground voltage source to the internal ground plane 19a as shown by the dotted line to pin 23.

In the first mode, switch 27 is programmed to be on (connected), so that ground point 28 provides a low signal to OR gate 26. This causes OR gate 26 to forward the signal on line 24 to line 24b. Line 24b drives the input terminal of inverter 22, which places the opposite logical value onto line 23a and thus onto pin 23.

In the second mode, when pin 23 is not needed for a logic signal, it is connected to an external ground voltage source such as 19b. Internally, switch 27 is programmed to be off (disconnected) so that pull-up resistor 25 provides a logical 1 to OR gate 26, causing OR gate 26 to provide a constant high output signal on line 24b regardless of the signal provided by macrocell 21 on line 24. Thus macrocell 21 can be used to generate a logic signal. The logic output signal on line 24 is fed back on line 24a to the internal logic structures of the device for use elsewhere. Meanwhile the high signal on line 24b causes transistor 22b to connect pin 23 to internal ground point 19a, stabilizing the internal ground voltage.

Figure 3:
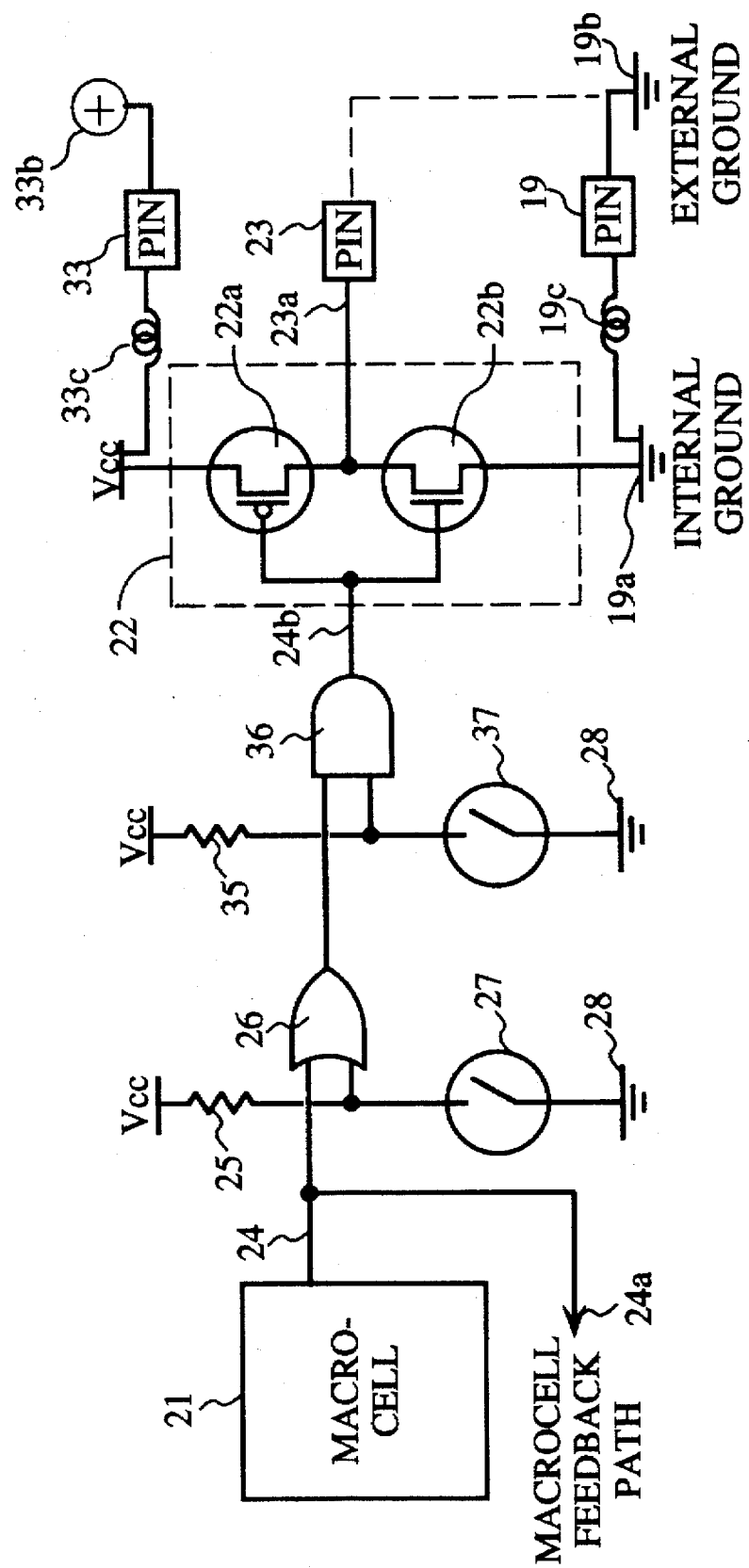
FIG. 3 shows another embodiment of the invention in which a switching structure between an internal logic block and means for driving an external pin allows the pin to serve as either a power pin or a ground pin while the internal logic block is used for internal logic.

FIG. 3 shows another embodiment which can stabilize either the ground voltage or the positive voltage supply. Elements of FIG. 3 having the same function as those of FIG. 2 are given the same reference numerals. Also illustrated in FIG. 3 is a connection from internal power supply Vcc through Vcc pin 33 to an external positive power source 33b. In addition to OR gate 26, FIG. 3 includes AND gate 36. If switch 37 is in a conductive state, switch 37 causes AND gate 36 to output a logic low signal, which turns on transistor 22a. A combination of making switch 37 conductive and connecting an external power source 33b to pin 23 (see dotted line) allows pin 23 to serve as an external power supply pin. If both of switches 27 and 37 are open, OR gate 26 is pulled high by resistor 25 and the combination of the logical high signal from OR gate 26 and the high voltage provided through resistor 35 to AND gate 36 places a high signal on line 24b, which turns on transistor 22b, connecting pin 23 to ground point 19a (see dotted line). If pin 23 is connected to an external ground voltage supply source 19b, internal ground point 19a then stabilizes the internal ground voltage. If switch 27 is conductive and switch 37 is nonconductive, the signal on line 24 is applied to line 24b, and in this configuration, pin 23 serves as an output pin for the function generated by macrocell 21.

The invention can be used with many switch technologies including CMOS, bipolar, flash, and EEPROM.

Other embodiments of the present invention will become obvious to those skilled in the art in light of the above disclosure, and are intended to fall within the scope of the present invention.

We claim:

1. A programmable voltage stabilizing circuit for a programmable integrated circuit device comprising:

an external pin extending from said integrated circuit device;

an output driver in said integrated circuit device having an output driver input terminal for connecting one of an internal positive voltage terminal and a first internal ground voltage terminal to said external pin in response to a voltage on said output driver input terminal;

an internal logic block in said integrated circuit device, said internal logic block having an output terminal; and means for operating said programmable voltage stabilizing circuit in one of two modes:

an ordinary mode in which a signal from said internal logic block output terminal drives said external pin; and a stabilizing mode in which one of said internal positive voltage terminal and said first internal ground voltage terminal is connected through a single pass device to said pin independently of said signal from said internal logic block.

2. A programmable voltage stabilizing circuit as in claim 1 in which said means for operating comprises means for driving said output driver input terminal by a signal at one of said internal logic block output terminal, a positive voltage supply terminal, and a ground voltage terminal.

3. A programmable voltage stabilizing circuit as in claim 1, wherein said internal ground voltage terminal is connected to an external ground and said internal positive voltage terminal is connected to an external voltage source.

4. A programmable voltage stabilizing circuit as in claim 3, wherein said external pin is also connected to an external voltage source.

5. A circuit for a programmable device comprising:

a logic block having an output terminal;

an external pin of said device;

a CMOS inverter having an input terminal, and having an output terminal connected to said external pin;

means for selectively driving said input terminal of said a CMOS inverter, wherein in a first mode said input terminal of said a CMOS inverter is driven independently of a signal at said output terminal of said logic block, and in a second mode said input terminal of said a CMOS inverter is driven by said signal at said output terminal of said logic block.

6. A logic circuit comprising:

a logic block having an output terminal;

an external pin;

an output driver connected to two internal voltage terminals, and having an input terminal and an output terminal, said output terminal being connected to said external pin; and means for gating signals to said output driver input terminal, wherein in a first mode a signal at said logic block output terminal is gated to said output driver input terminal, thereby causing said external pin to be at a voltage level dependent on said signal at said internal logic block output terminal; and in a second mode, a reference signal is gated to said output driver input terminal, thereby causing said external pin to be connected through a single pass device to said reference signal, but independent of said signal at said logic block output terminal.

* * * * *

UNITED STATES PATENT AND TRADEMARK OFFICE
CERTIFICATE OF CORRECTION

PATENT NO : 5,742,178
DATED : April 21, 1998
INVENTOR(S) : Jesse H. Jenkins, IV, Nicholas Kucharewski, Jr. and David Chiang It is certified that error appears in the above-identified patent and that said Letters Patent is hereby corrected as shown below:

Col. 4, line 32, delete "a"

Col. 4, line 34, delete "a"

Col. 4, line 37, delete "a"

Signed and Sealed this

Twenty-first Day of March, 2000

Attest:

Attesting Officer

Q. TODD DICKINSON

Commissioner of Patents and Trademarks